(12) United States Patent
Lallouet et al.

(10) Patent No.: US 12,274,031 B2
(45) Date of Patent: Apr. 8, 2025

(54) CRYOSTAT HOUSING FOR SUPERCONDUCTING WIRED CIRCUIT, AND ASSOCIATED SUPERCONDUCTING WIRED CIRCUITS

(71) Applicant: NEXANS, Courbevoie (FR)

(72) Inventors: Nicolas Lallouet, Baincthun (FR); Loïc Legrand, Audruicq (FR)

(73) Assignee: NEXANS, Courbevoie (FR)

( * ) Notice: Subject to any disclaimer, the term of this patent is extended or adjusted under 35 U.S.C. 154(b) by 0 days.

(21) Appl. No.: 17/518,548

(22) Filed: Nov. 3, 2021

(65) Prior Publication Data

US 2022/0183185 A1 Jun. 9, 2022

(51) Int. Cl.
H05K 7/20 (2006.01)
H01F 6/04 (2006.01)

(52) U.S. Cl.
CPC .......... *H05K 7/20372* (2013.01); *H01F 6/04* (2013.01)

(58) Field of Classification Search
CPC .... H02G 15/34; H05K 7/20372; H01B 12/16; Y02E 40/60; H01F 6/04; H01R 4/68; H01R 13/65912
See application file for complete search history.

(56) References Cited

U.S. PATENT DOCUMENTS

2006/0283620 A1* 12/2006 Maguire ................. H01B 12/16
174/125.1
2008/0110659 A1* 5/2008 Ashibe ..................... H01R 4/68
174/15.5
2012/0186854 A1* 7/2012 Choi ....................... H02G 15/34
174/22 R
2013/0065766 A1 3/2013 Yuan et al.
2013/0199821 A1* 8/2013 Teng ....................... H01B 12/02
174/125.1
2016/0261103 A1* 9/2016 Lallouet ................. H01R 24/66

FOREIGN PATENT DOCUMENTS

EP 0045239 A1 * 7/1981
EP 0045239 * 2/1982

OTHER PUBLICATIONS

International Search Report dated Jul. 5, 2021.

* cited by examiner

*Primary Examiner* — Frantz F Jules
*Assistant Examiner* — Martha Tadesse
(74) *Attorney, Agent, or Firm* — Sofer & Haroun, LLP

(57) ABSTRACT

A cryostat is provided for housing for a superconducting wired circuit. The cryostat has a dividing partition (10) delimiting two internal spaces; a first and a second opening situated one on each side of the dividing partition and each configured to fix one end of a cryogenic jacket surrounding at least one superconducting wire (21*a*) and to allow the superconducting wire to pass into the internal spaces. A third outlet opening is provided for a cooling fluid circulating in the cryogenic jacket fixed to the first opening. A fourth inlet opening is for a cooling fluid circulating in the cryogenic jacket fixed to the second opening. The dividing partition (10) incorporates a cavity forming a partition feedthrough (T) allowing the superconducting wire to pass through and sealed against the cooling fluids by the injection, once the wire has been fed through, of an electrically insulating material (17) in polymerizable liquid form, via an access opening (16) providing access to said cavity.

16 Claims, 2 Drawing Sheets

CRYOSTAT HOUSING FOR SUPERCONDUCTING WIRED CIRCUIT, AND ASSOCIATED SUPERCONDUCTING WIRED CIRCUITS

RELATED APPLICATION

This application claims the benefit of priority from French Patent Application No. 20 11360, filed on Nov. 5, 2020, the entirety of which is incorporated by reference.

TECHNICAL FIELD

The present invention relates to the general field of superconducting wired circuits and, more specifically, to a cryostat housing specifically suitable for different superconducting wired circuits.

TECHNOLOGICAL BACKGROUND

A superconducting cable allows high-strength electrical currents to be carried by a cross section of cable that is far smaller than that of a conventional cable made up of a resistive electrical conductor, while at the same time limiting electrical losses along the cable, notably the losses through a Joule-heating effect, because the latter effect is extremely weak in superconductors.

A superconducting cable is conventionally made up of at least a central superconducting wire surrounded by a cryogenic jacket. The cryogenic jacket comprises, for example, two concentric jackets thermally insulated from one another by a vacuum. A cooling fluid, such as helium or nitrogen, in liquid or gaseous form and contained inside the cryogenic jacket cools the central superconducting wire down to a temperature below what is known as the critical temperature at which this wire becomes superconducting.

It is known practice to use wired circuits made up either of a single superconducting cable of great length, or of a plurality of superconducting cables connected to one another in the series so as to carry a high-strength current over a long distance. With this type of circuit, if the cooling liquid is injected under pressure and at the critical temperature at an injection point situated at one end of the circuit, there is no guarantee that, on the one hand, the pressure will remain sufficient to allow the cooling fluid to circulate along the entire length of the circuit or that, on the other hand, the cooling liquid will not heat up to a temperature above the critical temperature as it travels along the circuit ever further away from the fluid injection point.

Other superconducting wired circuits for forming superconducting closed loops generating strong magnetic fields are known. Such a circuit comprises a superconducting cable comprising, in a single cryogenic jacket, a superconducting wire wound over several turns, the wire being made up either of a single superconducting wire or of a succession of series-connected elementary superconducting wires, each elementary wire forming one turn of the coil. Such a superconducting coil may, for example, be used, as described notably in document EP 2 732 075 B1, as a secondary electric circuit in an aluminium smelter, to compensate for the magnetic field created by a main electric circuit carrying an electrolysis current fed to a series of electrolysis vats, arranged in one or more row(s), intended for producing aluminium. This type of superconducting coil, a first end of the superconducting wire (or of the elementary wire that forms the first turn) and a second end of the superconducting wire (or of the elementary wire that forms the last turn) need to be electrically connected to the two electric poles of an electric power supply station that delivers a supply current of predetermined current strength. The number of turns made by the superconducting wire (or the number of elementary superconducting wires that are connected in series) depends on the strength of the supply current and on the strength of the magnetic field that it is desired to generate. By way of nonlimiting example, a superconducting coil comprising a superconducting wire wound over 21 turns passing side-by-side inside the single cryogenic jacket (or 21 elementary superconducting wires connected in series) and supplied with a 5 kA current, is able to generate a magnetic field corresponding to 105 kA. Here again, the length of the single cryogenic jacket enclosing the superconducting winding may be fairly great (of the order of several hundred metres) which means that it is necessary to plan for the cooling liquid intended to circulate through the loop to be injected at a sufficient pressure and to remain below the critical temperature.

SUMMARY OF THE INVENTION

It is an object of the present invention to propose cryostat housing solutions for superconducting wired circuits which solutions are particularly well suited to the management of the cooling liquids.

More specifically, a first subject matter of the present invention is a cryostat housing for a superconducting wired circuit, said cryostat housing comprising:

- a dividing partition delimiting a first space and a second space internal to the cryostat housing;
- a first opening and a second opening of the cryostat housing which are situated one on each side of the dividing partition, opening respectively onto the first internal space and onto the second internal space and each configured to fix one end of a cryogenic jacket surrounding at least one superconducting wire in a fluidtight manner, and to allow said at least one superconducting wire to pass respectively into the first internal space and into the second internal space;
- a third opening of the cryostat housing, communicating with the first internal space and intended to form an outlet for a cooling fluid circulating in the cryogenic jacket fixed to the first opening; and
- a fourth opening of the cryostat housing, communicating with the second internal space and intended to form an inlet for a pressurized cooling fluid circulating in the cryogenic jacket fixed to the second opening;

According to the invention, said dividing partition incorporating a cavity forms at least one partition feedthrough to allow said at least one superconducting wire to be fed through, and an access opening for accessing said cavity so as to allow, once said at least one superconducting wire has been fed through, said cavity to be filled with an electrically insulating material injected in the form of a polymerizable liquid so as to seal said at least one partition feedthrough against the cooling fluids.

In one possible embodiment, said dividing partition incorporates a plurality of cavities each forming a partition feedthrough through which a wire of a plurality of superconducting wires can be fed, and one access opening per cavity, to allow each cavity to be filled separately by injecting electrically insulating material into each cavity.

As a variant, said dividing partition incorporates a single cavity forming a plurality of partition feedthroughs through each of which a wire of a plurality of superconducting wires can be fed, the filling of the single cavity by injecting the electrically insulating material in polymerizable liquid form allowing each partition feedthrough to be sealed against the cooling fluids.

In one possible embodiment, the cryostat housing comprises at least a fifth opening allowing the injection, from an input electrical termination external to the cryostat housing, of an electrical current on a first end of a superconducting wire fed through the dividing partition.

The fifth opening may further allow an electrical current to be collected at a second end of the superconducting wire on an output electrical termination external to the cryostat housing. As a variant, the cryostat housing comprises a sixth opening to allow an electrical current to be collected at a second end of the superconducting wire on an output electrical termination external to the cryostat housing.

In one possible embodiment said at least one fluidtight partition feedthrough may be dimensioned to accept a connector for the series-connection of two elementary superconducting wires that make up said at least one superconducting wire.

In one possible embodiment said at least one partition feedthrough comprises two substantially cylindrical ends extending transversely one on each side of the dividing partition, each end being equipped with a centring ring made of an electrically insulating material.

Other subject-matters of the present invention include various superconducting wired electrical circuits using various embodiments of the cryostat housing:

A first superconducting wired electrical circuit according to the invention comprises:
- a first superconducting cable comprising a first cryogenic jacket surrounding at least a first superconducting wire and inside which a first cooling fluid circulates;
- a second superconducting cable comprising a second cryogenic jacket surrounding at least a second superconducting wire and inside which a second cooling fluid circulates;
- a cryostat housing according to the first subject-matter of the invention and connecting the first superconducting cable and the second superconducting cable in such a way that:
  - one end of the first cryogenic jacket is fixed in a fluidtight manner to the first opening of the cryostat housing;
  - one end of the second cryogenic jacket is fixed in a fluidtight manner to the second opening of the cryostat housing;
  - the first cooling fluid exits via the third opening of the cryostat housing;
  - the second cooling fluid enters via the fourth opening of the cryostat housing; and
  - said at least one first superconducting wire and/or said at least one second superconducting wire passes through said at least one fluidtight partition feedthrough; and
- at least one connector inside the cryostat housing connecting said at least one first superconducting wire and said at least one second superconducting wire electrically in series.

Said at least one connector may be placed in the first internal space or in the second internal space of the cryostat housing. As a variant, said at least one connector is placed in said at least one fluidtight partition feedthrough.

The circuit advantageously further comprises a cooling-fluid management device external to the cryostat housing and configured to receive the first cooling fluid leaving the third opening and to inject the second cooling liquid under pressure through the fourth opening.

Another superconducting wired electric circuit according to the invention, able to form a a superconducting closed electrical loop comprises:
- a superconducting cable comprising a superconducting wire wound over several turns and a single cryogenic jacket inside which said turns pass, side-by-side;
- a cryostat housing according to the first subject-matter of the invention and further comprising the fifth or even the sixth opening and connected to said superconducting cable in such a way that:
  - a first end of the single cryogenic jacket is fixed in a fluidtight manner to the first opening of the cryostat housing;
  - a second end of the single cryogenic jacket is fixed in a fluidtight manner to the second opening of the cryostat housing;
  - each turn of the superconducting wire passes through a distinct feedthrough of the plurality of fluidtight partition feedthroughs of the dividing partition of said cryostat housing;
  - a pressurized cooling fluid enters via the fourth opening of the cryostat housing and circulates in the single cryogenic jacket;
  - said cooling fluid exits via the third opening of the cryostat housing;
- an input electrical termination connected to a first end of the superconducting wire through the fifth opening of the cryostat housing for injecting an electrical current onto said superconducting wire; and
- an output electrical termination connected to a second end of the superconducting wire through the fifth opening or the sixth opening of the cryostat housing for collecting the electrical current circulating in said superconducting wire.

In one possible embodiment, each turn of said superconducting wire consists of an elementary superconducting wire, two successive elementary superconducting wires being connected in series by a connector placed inside the cryostat housing.

In one possible embodiment, at least one fluidtight partition feedthrough of said cryostat housing is dimensioned to accept the connector that connects two successive elementary superconducting wires.

Another superconducting wired electrical circuit according to the invention comprises:
- a superconducting cable comprising a cryogenic jacket surrounding at least one superconducting wire and inside which a first cooling fluid circulates;
- a cryostat housing according to the first subject-matter of the invention and connected to said superconducting cable in such a way that:
  - the cryogenic jacket is fixed in a fluidtight manner to, on the one hand, the first opening and, on the other hand, the second opening of the cryostat housing;
  - said at least one superconducting wire passes through said at least one fluidtight partition feedthrough;
  - a first cooling fluid circulating in the cryogenic jacket and entering the cryostat housing by the first opening leaves via the third opening of the cryostat housing;
  - a pressurized second cooling fluid enters via the fourth opening of the cryostat housing and circulates in the cryogenic jacket via the second opening.

In one possible embodiment, this other superconducting wired electric circuit further comprises a cooling-fluid management device external to the cryostat housing and configured to receive the first cooling fluid leaving the third opening and to inject the second cooling liquid under pressure through the fourth opening.

BRIEF DESCRIPTION OF THE FIGURES

The following description provided with reference to the appended drawings, which are given by way of non-limiting example, will make it easy to understand what the invention consists of and how it may be implemented. In the appended figures.

DESCRIPTION OF ONE OR MORE EMBODIMENTS

In the figures, identical or equivalent elements will bear the same reference signs. The various diagrams are not to scale.

Throughout the description, what is meant by a superconducting wire (or by an elementary superconducting wire) is any longitudinal superconducting element or element comprising a longitudinal core made of metal (for example copper) surrounded by at least one superconducting layer (formed for example of several superconducting wires or tapes surrounding the copper core).

Figure 1:
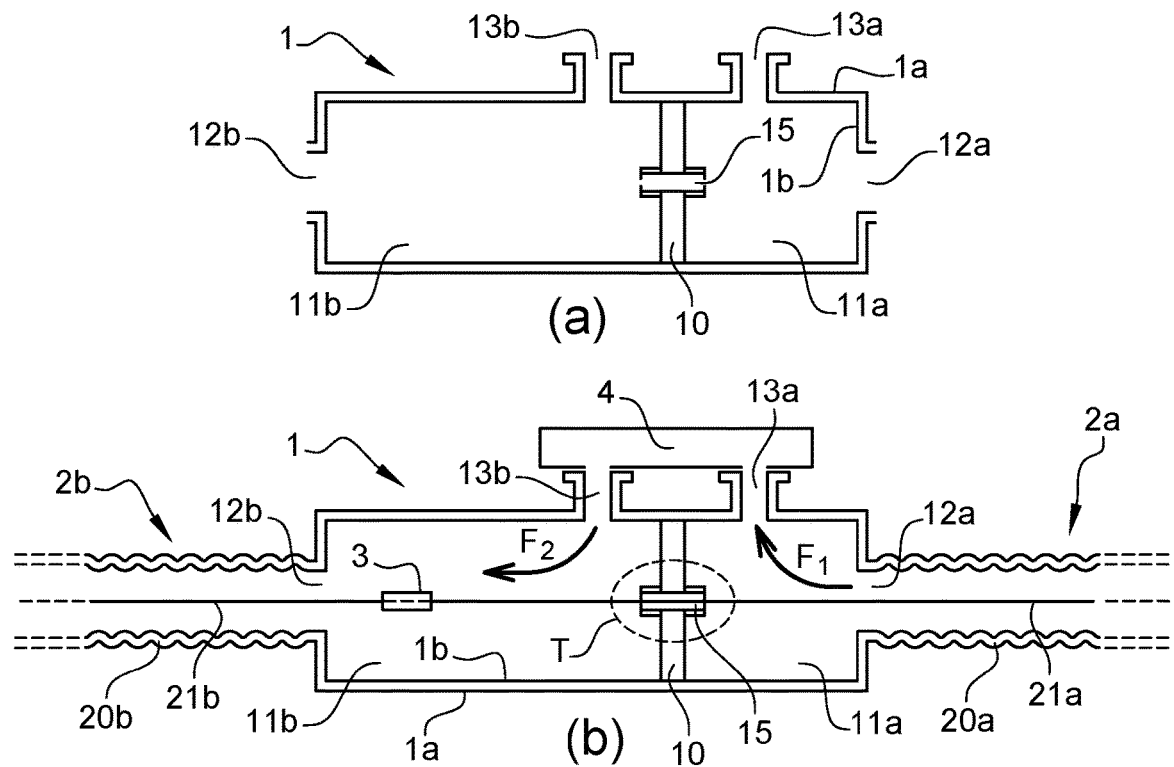
FIG. 1 schematically illustrates a view (a) showing a cryostat housing according to a first embodiment of the invention, and a view (b) showing an example of a superconducting wired electric circuit using this cryostat housing.

FIG. 1 schematically illustrates a first embodiment of a cryostat housing 1 according to the invention, particularly well suited to superconducting wired circuits extending between two distant points, and an example of the use of this cryostat housing. More specifically, view (a) of FIG. 1 shows the cryostat housing 1 alone, prior to use in any circuit, and view (b) illustrates a portion of an example of a superconducting wired circuit using this cryostat housing 1.

As visible in this FIG. 1, the cryostat housing 1, made from any electrically conducting material, preferably stainless steel, comprises a dividing partition 10 delimiting a first space 11a and a second space 11b which are internal to the cryostat housing 1. The housing 1 preferably comprises two concentric jackets 1a, 1b separated by vacuum.

The cryostat housing 1 further comprises a first opening 12a and a second opening 12b providing access to the cryostat housing and situated one on each side of the dividing partition 10 and opening respectively onto the first internal space 11a and onto the second internal space 11b. Each of these first and second openings 12a, 12b is configured to allow the fluid tight fixing of one end of a cryogenic jacket surrounding at least one superconducting wire and to allow said at least one superconducting wire to pass respectively into the first internal space 11a and into the second internal space 11b. Thus, as more particularly visible in view (b), an example of a superconducting wired circuit using the cryostat housing 1 of view (a) comprises:

a first superconducting cable 2a comprising a first cryogenic jacket 20a surrounding at least a first superconducting wire 21a and inside which a first cooling fluid circulates;

a second superconducting cable 2b comprising a second cryogenic jacket 20b surrounding at least a second superconducting wire 21b and inside which a second cooling fluid circulates;

the first superconducting cable 2a and the second superconducting cable 2b being connected to the cryostat housing 1 in such a way that one end of the first cryogenic jacket 20a is fixed in a fluidtight manner, by any known means, to the first opening 12a of the cryostat housing 1 and one end of the second cryogenic jacket 20b is fixed in a fluidtight manner, by any known means, to the second opening 12b of the cryostat housing 1. As can be seen in view (b), the two concentric jackets forming the cryogenic jackets 20a and 20b of each of the two superconducting cables 2a and 2b are fixed to the two concentric jackets 1a and 1b that form the housing 1 at the openings 12a and 12b.

The cryostat housing 1 further comprises a third opening 13a communicating with the first internal space 11a. This third opening 13a is intended to form an outlet for a cooling fluid circulating in a cryogenic jacket fixed to the first opening 12a. In the example of a circuit that it is depicted schematically in view (b) of FIG. 1, the third opening 13a forms an outlet for the first cooling fluid circulating in the cryogenic jacket 20a of the first superconducting cable 2a and entering the first internal space 11a as depicted by the circulation arrow $F_1$.

The cryostat housing 1 further comprises a fourth opening 13b communicating with the second internal space 11b. This fourth opening 13b is intended to form an inlet for a pressurized cooling fluid circulating in a cryogenic jacket fixed to the second opening 12b. In the example of a circuit that it is depicted in view (b) of FIG. 1, the fourth opening 13b forms an inlet for the second cooling fluid entering the second internal space 11b and then circulating in the cryogenic jacket 20b of the second superconducting cable 2b as depicted by the circulation arrow $F_2$.

Because the dividing partition 10 is intended to have at least one superconducting wire fed through it, which wire also passes through the first opening 12a and/or the second opening 12b, such as the superconducting wire 21a or 21b of the first cable 2a or of the second cable 2b, the dividing partition 10, according to the invention, incorporates a cavity 15 that forms at least one partition feedthrough sealed against the cooling fluids so as to allow said at least one superconducting wire to be fed through. In the nonlimiting example of view (b), it is the superconducting wire 21a of the first cable 2a that is fed through the dividing partition 10 via the fluidtight partition feedthrough.

Figure 2:
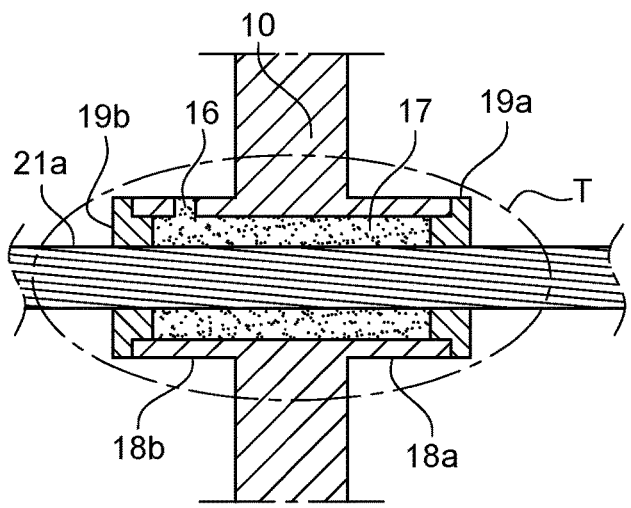
FIG. 2 is an enlargement of part of FIG. 1 showing a fluidtight partition feedthrough according to the invention.

To do this, and as is more particularly visible in the diagram of FIG. 2 which is a close-up of T in view (b) of FIG. 1, the dividing partition 10 incorporates an access opening 16 providing access to the cavity 15 and preferably opening onto the first internal space 11a or, as illustrated in FIG. 1, onto the second internal space 11b, so as to allow, once said at least one superconducting wire 21a, 21b has been fed through, the cavity 15 to be filled with an electrically insulating material 17 injected in the form of a polymerizable liquid. FIG. 2 schematically illustrates the partition feedthrough sealed following the polymerization of the electrically insulating material 17 around the superconducting wire 21a through the wall 10. The electrically insulating material 17 is, for example, a two-part epoxy resin that polymerizes at ambient temperature, or any other electrically insulating material that polymerizes, preferably at ambient temperature, and is able to withstand cryogenic temperatures.

In order to prevent the superconducting wire that passes through the partition 10 from being in contact with the walls of the partition feedthrough during the operation of injecting electrically insulating material 17 in liquid form, the partition feedthrough comprises two substantially cylindrical ends 18a, 18b extending transversely one on each side of the dividing partition 10, each end 18a, 18b being equipped with a centring ring 19a, 19b made of an electrically insulating material and through which the superconducting wire, in the example the wire 21a, can be fed prior to the injection operation. The access opening 16 may be borne by one of the ends, for example the end 18b, as depicted in FIG. 2. The material used for the centring rings 19a, 19b is chosen to withstand the critical temperatures of the cooling fluids. It is possible, for example, to opt for G10 glassfibre epoxy or tetrafluoroethylene. In order to improve still further the fluidtightness of the system during the operation of injecting the electrically insulating material in liquid form, two retractable sleeves (not depicted) may advantageously be used, each retractable sleeve forming a sealed connection between each centring ring 19a, 19b and the superconducting wire fed through the partition.

In the nonlimiting example of the wired circuit depicted in view (b) of FIG. 1, in which the cryostat housing 1 connects two distinct superconducting cables 2a and 2b each having their own cryogenic jacket respectively 20a, 20b, each surrounding at least one superconducting wire respectively 21a, 21b, the superconducting wired circuit further comprises a connector 3 inside the cryostat housing 1, this connector 3 connecting the first superconducting wire 21a and the second superconducting wire 21b electrically in series.

In the nonlimiting example corresponding to view (b), it is the first wire 21a of the first superconducting cable 2a that is fed through the dividing partition 10 so that the connector 3 is placed in the second internal space 11b of the cryostat housing 1. As a first variant, it is conceivable for it to be the superconducting wire 21b of the second superconducting cable 2b that is fed through the dividing partition 10, in which case the connector 3 would be placed in the first internal space 11a. In both cases, the operation of connecting together the two superconducting wires 21a and 21b cannot be performed until after the first superconducting wire 21a or the second superconducting wire 21b has been fed through the dividing partition, although it can be performed indifferently either before or after the operation of injecting material in liquid form. As a second variant (not depicted), provision may be made for the partition feedthrough to be dimensioned to accept the connector 3 for the series-connection of the two superconducting wires 21a and 21b. Implementations involving placing the connector 3 in the second internal space 11b, namely on the side where the second cooling fluid is injected through the fourth opening 13b are nevertheless preferred because these allow the connector 3, which is liable to generate resistive losses, to be subjected to a cooling-fluid temperature that is lower than the critical temperature and that encourages the superconducting state.

In an embodiment variant which has not been depicted and which is particularly well suited to situations in which the cryogenic jackets fixed to the first and second openings 12a, 12b of the cryostat housing surround not a single superconducting wire but a plurality of superconducting wires, the dividing partition 10 incorporates that same number of cavities 15, each forming a partition feedthrough to allow a superconducting wire to be fed through, and each comprising an access opening 16. It is thus possible to seal each partition feedthrough against the cooling fluids by filling each cavity separately with the insulating material in liquid form.

Figure 3:
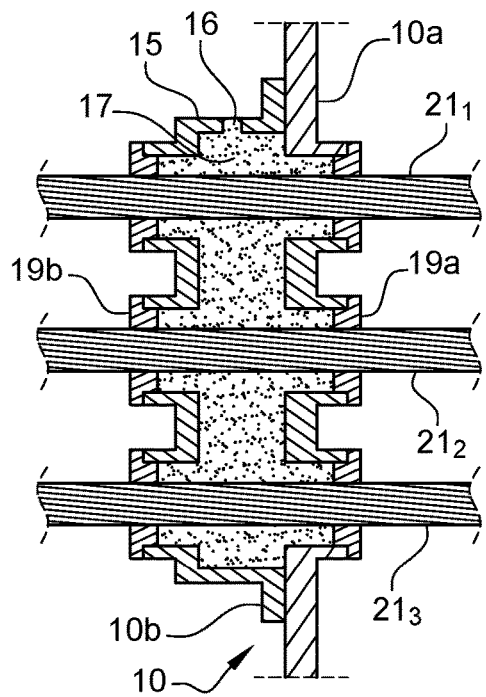
FIG. 3 illustrates a variant embodiment of a plurality of fluidtight feedthroughs in the one same dividing partition.

The creation of a plurality of partition feedthroughs, each sealed against the cooling fluids, may also be facilitated by the variant embodiment of the dividing partition 10 of the cryostat housing which variant is depicted in section in FIG. 3. In this nonlimiting example, the dividing partition 10 has, fed through it, three superconducting wires $21_1$, $21_2$, $21_3$ coming, for example, from a superconducting cable of which the cryogenic jacket has been fixed to the first opening 12a or to the second opening 12b of the cryostat housing. Here, the dividing partition 10 is formed not of a single wall but of two walls 10a, 10b fixed to one another and configured to define a single cavity 15 forming a plurality (three in the example) of partition feedthroughs each allowing one of the superconducting wires $21_1$, $21_2$, $21_3$ to be fed through it. One of the walls, in this instance the wall 10b, comprises an access opening 16 providing access to the cavity, preferably on the upper part of the wall 10b. After the superconducting wires $21_1$, $21_2$, $21_3$ have been fed through their respective partition feedthrough, the filling of the single cavity 15 by injecting electrically insulating material in the form of a polymerizable liquid through the access opening 16 allows each partition feedthrough to be sealed simultaneously against the cooling fluids. Centring rings 19a, 19b, similar to the rings described with reference to FIG. 2, are also used at the two cylindrical ends forming each partition feedthrough in order to prevent the superconducting wires from being in contact with the internal walls of their respective partition feedthrough before the injection operation.

In the configuration shown in view (b) of FIG. 1, with a dividing partition according to FIG. 2 or FIG. 3, the cryostat housing both allows electrical connection between two superconducting cables 2a, 2b, each comprising one or more superconducting wires, thanks to the presence of one or more partition feedthroughs, and allows effective management of the circulation of the cooling fluids thanks to the fact that the partition feedthrough is sealed against the cooling fluids.

The circuit may thus comprise any cooling-fluid management device 4 external to the cryostat housing 1, configured to receive the first cooling fluid leaving the third opening 13a, and to inject the second cooling fluid under pressure and at a temperature lower than the critical temperature associated with the second superconducting wire 21b, through the fourth opening 13b. In one possible implementation, the device 4 may for example collect, via the third opening 13a of the housing, the first cooling fluid coming from the first cable 2a, the temperature of which has risen as it progressively passes along the superconducting cable 2a, and then reinject it in the form of the second cooling fluid, once it has adapted the pressure and temperature needed respectively for correct circulation of the fluid in the second cable 2b and for correct cooling of the superconducting wire 1b. As a variant, the first cooling fluid and the second cooling fluid are of different natures. In particular it is possible to anticipate creating a wired line of very great length, by connecting a succession of superconducting cables in such a way that two cables that succeed one another in the line are connected by means of a cryostat housing and of a fluid management system which are in accordance with the invention.

In the schematic depiction given in view (b) of FIG. 1, it has been considered that the cryostat housing 1 is used to connect two distinct cables 2a, 2b. Another example of a use of the cryostat housing 1 of FIG. 1(a) is illustrated schematically in FIG. 4. This example of a superconducting wired electric circuit differs from the first example illustrated schematically in FIG. 1(b) only in that it uses a single superconducting cable 2 comprising a superconducting wire 21 surrounded by a cryogenic jacket. The references 20a and 20b in FIG. 4 here illustrate two portions of the cryogenic jacket which are fixed in a fluidtight manner to the respective openings 12a and 12b of the cryostat housing 1. As visible in FIG. 4, the superconducting wire 21 is fed through the dividing partition 10 via the partition feedthrough that is sealed, as explained hereinabove, by the injection of the electrically insulating material in liquid form into the cavity 15. Here again, a first cooling fluid circulating in the portion 20a of the cryogenic jacket will enter the cryostat housing via the first opening 12a of the cryostat housing 1 and then leave via the third opening 13a of the cryostat housing 1 (arrow $F_1$), and a pressurized second cooling fluid will be able to enter via the fourth opening 13b of the cryostat housing 1 and circulate in the portion 20b of the cryogenic jacket via the second opening 12b (arrow $F_2$). As in the previous example, a cooling-fluid management device 4 external to the cryostat housing 1 receives the first cooling fluid leaving the third opening 13a and the temperature of which has risen as it progressively passes along the portion 20a of the cryogenic jacket, and injects the second cooling liquid under pressure and at a temperature lower than the critical temperature of the superconducting wire 21 through the fourth opening 13b. As previously, the second cooling liquid may be the first cooling liquid the temperature of which has been lowered by comparison with the temperature that the first cooling liquid has reached when it leaves the third opening 13a, so that it once again reaches a temperature below the critical temperature. As a variant, the first cooling fluid and the second cooling fluid may be of different natures.

Figure 4:
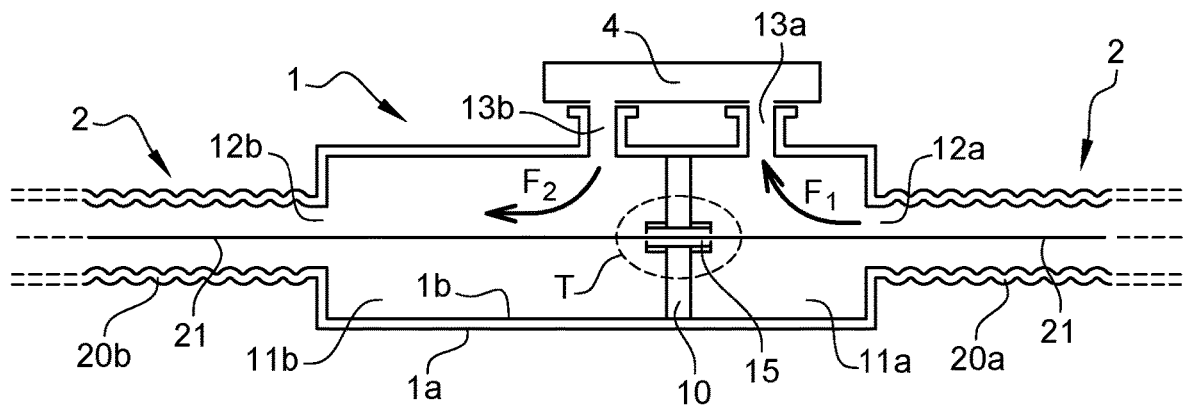
FIG. 4 schematically illustrates another example of a superconducting wired electrical circuit using the cryostat housing of FIG. 1.

In a variant embodiment, not depicted, of the circuit of FIG. 4, the superconducting cable 2 may comprise several superconducting wires fed through the one same partition feedthrough sealed against the cooling fluids. In another variant embodiment, not depicted, of the circuit of FIG. 4, the superconducting cable 2 may comprise several superconducting wires each fed through a fluidtight partition feedthrough of the dividing partition of the cryostat housing, each feedthrough being obtained according to the principles explained hereinabove with reference to FIG. 2 or to FIG. 3.

Figure 5:
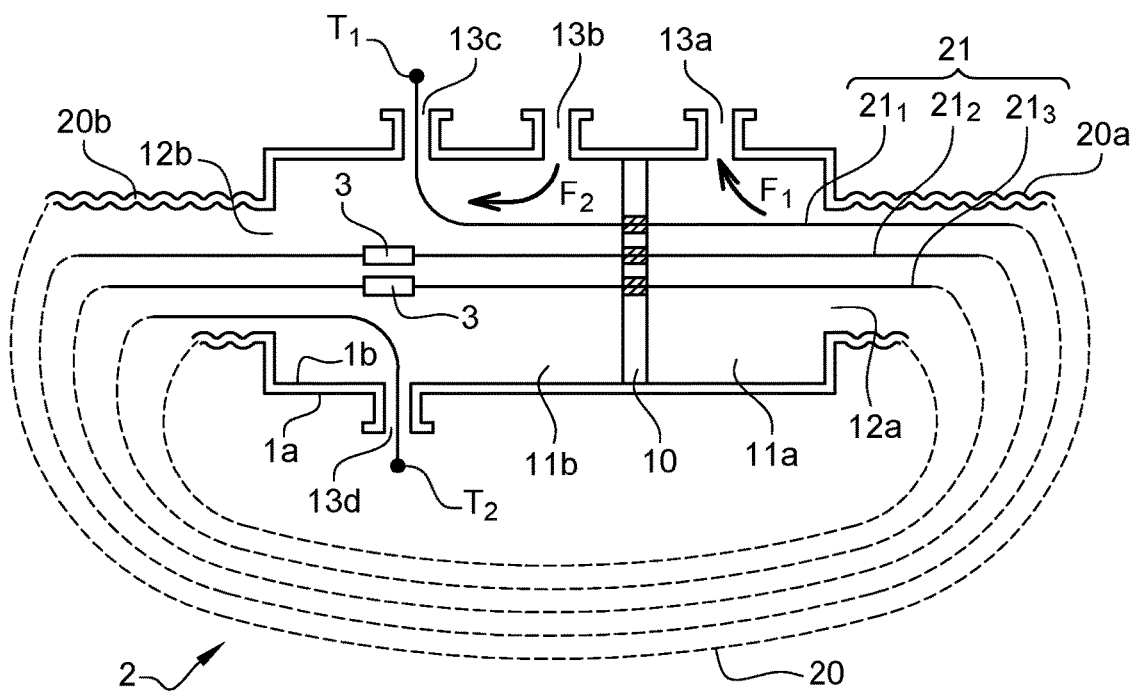
FIG. 5 schematically illustrates an example of a superconducting wired electrical circuit forming a superconducting closed loop and using a cryostat housing according to a second embodiment of the invention.

Another example of a superconducting wired circuit using a cryostat housing according to a second embodiment of the invention will now be described with reference to FIG. 5. The superconducting wired electric circuit here forms a superconducting closed electrical loop and comprises a superconducting cable 2 comprising a superconducting wire 21 wound over several turns (three turns in the nonlimiting example of FIG. 5) and a single cryogenic jacket 20 through which said turns, electrically insulated from one another, pass side-by-side. The superconducting wire 21 is preferably made up of a succession of elementary superconducting wires connected in series, each elementary wire forming one turn of the winding. In the example of FIG. 5, three elementary superconducting wires $21_1$, $21_2$ and $21_3$ are illustrated, each forming one turn of the winding.

The cryostat housing 1 according to the second embodiment is very similar to the cryostat housing of view (a) of FIG. 1, in that it comprises:

two concentric jackets 1a, 1b separated by vacuum;

a dividing partition 10 delimiting a first space 11a and a second space 11b internal to the cryostat housing 1;

a first opening 12a and a second opening 12b of the cryostat housing 1 these openings being situated one on each side of the dividing partition 10 and opening respectively onto the first internal space 11a and onto the second internal space 11b;

a third opening 13a communicating with the first internal space 11a and intended to form an outlet for a cooling fluid; and a fourth opening 13b communicating with the second internal space 11b and intended to form an inlet for a cooling fluid.

The dividing partition 10 incorporates as many partition feedthroughs as there are turns in the winding. In the example of FIG. 5, three partition feedthroughs have been schematically depicted, each having one elementary superconducting wire $21_1$, $21_2$ and $21_3$ fed through it. These partition feedthroughs are sealed against the cooling fluids in the same way as in the case of the partition feedthrough described in FIG. 2. As a variant, these feedthroughs are formed of a single cavity, which, when filled with an electrically insulating material injected in the form of a polymerizable liquid, yields three fluidtight feedthroughs simultaneously, as explained with reference to FIG. 3.

For this circuit forming a closed loop, the cryostat housing 1 is thus connected to the superconducting cable 2 in such a way that:

a first end 20a of the single cryogenic jacket 20 is fixed in a fluidtight manner to the first opening 12a of the cryostat housing 1, the two concentric jackets forming the first end 20a of the cryogenic jacket 20 of the superconducting cable 2 being fixed for example to the two concentric jackets 1a and 1b forming the housing 1 at the first opening 12a;

a second end 20b of the single cryogenic jacket 20 is fixed in a fluidtight manner to the second opening 12b of the cryostat housing 1, the two concentric jackets forming the second end 20b of the cryogenic jacket 20 of the superconducting cable 2 being fixed for example to the two concentric jackets 1a and 1b forming the housing 1 at the second opening 12b;

each turn of the superconducting wire passes through a distinct feedthrough of the three fluidtight partition feedthroughs of the dividing partition 10;

a pressurized cooling fluid enters via the fourth opening 13b of the cryostat housing 1 (arrow $F_2$) and circulates in the single cryogenic jacket 20;

the cooling fluid exits via the third opening 13a of the cryostat housing (arrow $F_1$).

The cryostat housing 1 depicted in FIG. 5 also comprises:

a fifth opening 13c allowing the injection, from an input electrical termination $T_1$ of the electric circuit, external to the cryostat housing, of an electrical current on a first end of the superconducting wire 21.

A sixth opening 13d to allow an electrical current to be collected at a second end of the superconducting wire on an output electrical termination $T_2$ of the electric circuit, external to the cryostat housing.

As a variant which has not been depicted, the housing has no sixth opening. In that case, the output electrical termination $T_2$ of the electric circuit is situated in the vicinity of the input electric termination $T_1$ and of the fifth opening 13c, the latter allowing the current to be injected on one end of the wire 21 (in this instance the free end of the elementary wire $21_1$ forming the first turn of the winding) and allowing the current to be collected on the other end of the wire 21 (in this instance on the free end of the elementary wire 21₃ forming the third and last turn of the winding).

Because the wire 21 here consists of a succession of elementary wires, two successive elementary superconducting wires are connected in series using a connector 3. FIG. 5 thus shows two connectors 3, one for connecting the first elementary wire 21₁ and the second elementary wire 21₂, and the other for connecting the second elementary wire 21₂ and the third elementary wire 21₃.

Of course, the connectors are not required if the superconducting wire 21 is planned to be long enough to be wound over the desired number of turns.

The connectors 3 are advantageously placed inside the cryostat housing 1, preferably on the side of the internal space 11b into which the cooling fluid is injected. As a variant which has not been depicted, at least one fluidtight partition feedthrough of said cryostat housing is dimensioned to accept the connector that connects two successive elementary superconducting wires.

In the configuration shown in FIG. 5, the cryostat housing advantageously constitutes a junction unit housing simultaneously allowing:
   electrical connection of the various elementary superconducting wires that make up the different turns of the winding;
   a current to be circulated along the elementary wires by virtue of the openings 13b/13c allowing connections to the input termination T₁ and output termination T₂;
   and the circulation of a cooling fluid inside the closed loop, this circulation being rendered possible through the presence of a dividing partition that is sealed against the cooling fluid between the opening 13a and the opening 13b.

The invention claimed is:

1. A cryostat housing for superconducting wired circuit, said cryostat housing comprising:
   a dividing partition delimiting a first space and a second space internal to the cryostat housing; a first opening and a second opening of the cryostat housing which are situated one on each side of the dividing partition, opening respectively onto the first internal space and onto the second internal space and each configured to fix one end of a cryogenic jacket surrounding at least one superconducting wire in a fluidtight manner so that the at least one superconducting wire passes respectively into the first internal space and into the second internal space;
   a third opening of the cryostat housing, communicating with the first internal space and forming an outlet for a cooling fluid circulating in the cryogenic jacket fixed to the first opening;
   a fourth opening of the cryostat housing, communicating with the second internal space and forming an inlet for a pressurized cooling fluid circulating in the cryogenic jacket fixed to the second opening; wherein said dividing partition incorporates a cavity forming at least one partition feedthrough through which said at least one superconducting wire passes, said at least one partition feedthrough comprising walls with two substantially cylindrical ends extending transversely one on each side of the dividing partition, each end being equipped with a centering ring made of an electrically insulating material, and an access opening for accessing said cavity and through which, once said at least one superconducting wire has been fed through, said cavity is filled with an electrically insulating material injected in the form of a polymerizable liquid that polymerizes at ambient temperature so as to seal said at least one partition feedthrough against the cooling fluid.

2. The cryostat housing according to claim 1, wherein said dividing partition incorporates a plurality of cavities each forming a partition feedthrough through which a wire of a plurality of superconducting wires passes, and one access opening per cavity, through which each cavity is filled separately with the electrically insulating material injected in liquid form.

3. The cryostat housing according to claim 1, wherein said dividing partition incorporates a single cavity forming a plurality of partition feedthroughs through each of which a wire of a plurality of superconducting wires passes, the filling of the single cavity by injecting the electrically insulating material in polymerizable liquid form allowing each partition feedthrough to be sealed against the cooling fluid.

4. The cryostat housing according to claim 2, wherein said cryostat comprises at least a fifth opening allowing an injection, from an input electrical termination external to the cryostat housing, of an electrical current on a first end of a superconducting wire passing through the dividing partition.

5. The cryostat housing according to claim 4, wherein the fifth opening also allows an electrical current to be collected at a second end of the superconducting wire on an output electrical termination external to the cryostat housing.

6. The cryostat housing according to claim 4, wherein said cryostat comprises a sixth opening to allow an electrical current to be collected at a second end of the superconducting wire on an output electrical termination external to the cryostat housing.

7. The cryostat housing according to claim 1, wherein said at least one fluidtight partition feedthrough is dimensioned to accept a connector for the series-connection of two elementary superconducting wires that make up said at least one superconducting wire.

8. A superconducting wired electrical circuit comprising:
   a first superconducting cable comprising a first cryogenic jacket surrounding at least a first superconducting wire and inside which a first cooling fluid circulates;
   a second superconducting cable comprising a second cryogenic jacket surrounding at least a second superconducting wire and inside which a second cooling fluid circulates;
   a cryostat housing according to claim 1, connecting the first superconducting cable and the second superconducting cable in such a way that:
      one end of the first cryogenic jacket is fixed in a fluidtight manner to the first opening of the cryostat housing;
      one end of the second cryogenic jacket is fixed in a fluidtight manner to the second opening of the cryostat housing;
      the first cooling fluid exits via the third opening of the cryostat housing;
      the second cooling fluid enters via the fourth opening of the cryostat housing; and
      said at least one first superconducting wire and/or said at least one second superconducting wire passes through said at least one fluidtight partition feedthrough; and
   at least one connector inside the cryostat housing connecting said at least one first superconducting wire and said at least one second superconducting wire electrically in series.

9. The superconducting wired electric circuit according to claim 8, wherein said at least one connector is placed in the first internal space or in the second internal space of the cryostat housing.

10. The superconducting wired electric circuit according to claim 8, wherein said at least one connector is placed in said at least one fluidtight partition feedthrough.

11. The superconducting wired electric circuit according to claim 8, wherein said superconducting wired electric circuit further comprises a cooling-fluid management device external to the cryostat housing and configured to receive the first cooling fluid leaving the third opening and to inject the second cooling liquid under pressure through the fourth opening.

12. A superconducting wired electric circuit forming a superconducting closed electrical loop comprising:
   a superconducting cable comprising a superconducting wire wound over several turns and a single cryogenic jacket through which said turns pass, side-by-side;
   a cryostat housing according to claim 5, connected to said superconducting cable in such a way that:
      a first end of the single cryogenic jacket is fixed in a fluidtight manner to the first opening of the cryostat housing;
      a second end of the single cryogenic jacket is fixed in a fluidtight manner to the second opening of the cryostat housing;
      each turn of the superconducting wire passes through a distinct feedthrough of the plurality of fluidtight partition feedthroughs of the dividing partition of said cryostat housing;
      a pressurized cooling fluid enters via the fourth opening of the cryostat housing and circulates in the single cryogenic jacket;
      said cooling fluid exits via the third opening of the cryostat housing;
   an input electrical termination connected to a first end of the superconducting wire through the fifth opening of the cryostat housing for injecting an electrical current onto said superconducting wire; and
   an output electrical termination connected to a second end of the superconducting wire through the fifth opening or the sixth opening of the cryostat housing for collecting the electrical current circulating in the superconducting wire.

13. The superconducting wired electric circuit according to claim 12, wherein each turn of said superconducting wire includes of an elementary superconducting wire, two successive elementary superconducting wires being connected in series by a connector placed inside the cryostat housing.

14. The superconducting wired electric circuit according to claim 13, wherein at least one fluidtight partition feedthrough of said cryostat housing is dimensioned to accept the connector that connects two successive elementary superconducting wires.

15. A superconducting wired electrical circuit comprising:
   a superconducting cable comprising a cryogenic jacket surrounding at least one superconducting wire and inside which a first cooling fluid circulates;
   a cryostat housing according to claim 1, connected to said superconducting cable in such a way that:
      the cryogenic jacket is fixed in a fluidtight manner to, on the one hand, the first opening and, on the other hand, the second opening of the cryostat housing;
      said at least one superconducting wire passes through said at least one fluidtight partition feedthrough;
      a first cooling fluid circulating in the cryogenic jacket and entering the cryostat housing by the first opening leaves via the third opening of the cryostat housing;
      a pressurized second cooling fluid enters via the fourth opening of the cryostat housing and circulates in the cryogenic jacket via the second opening.

16. The superconducting wired electric circuit according to claim 15, wherein said superconducting wired electric circuit further comprises a cooling-fluid management device external to the cryostat housing and configured to receive the first cooling fluid leaving the third opening and to inject the second cooling liquid under pressure through the fourth opening.

* * * * *